US011565253B2

(12) United States Patent
Kazoe et al.

(10) Patent No.: US 11,565,253 B2
(45) Date of Patent: Jan. 31, 2023

(54) NANO-FLUIDIC DEVICE AND CHEMICAL ANALYSIS APPARATUS

(71) Applicant: JAPAN SCIENCE AND TECHNOLOGY AGENCY, Kawaguchi (JP)

(72) Inventors: Yutaka Kazoe, Tokyo (JP); Yuriy Pihosh, Tsukuba (JP); Takehiko Kitamori, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 117 days.

(21) Appl. No.: 15/764,529

(22) PCT Filed: Oct. 21, 2016

(86) PCT No.: PCT/JP2016/081315
§ 371 (c)(1),
(2) Date: Mar. 29, 2018

(87) PCT Pub. No.: WO2017/069256
PCT Pub. Date: Apr. 27, 2017

(65) Prior Publication Data
US 2018/0280974 A1    Oct. 4, 2018

(30) Foreign Application Priority Data
Oct. 23, 2015    (JP) .............................. JP2015-209235

(51) Int. Cl.
*B01L 3/00*    (2006.01)
*B82B 1/00*    (2006.01)
(Continued)

(52) U.S. Cl.
CPC ... *B01L 3/502738* (2013.01); *B01L 3/502715* (2013.01); *B81B 1/00* (2013.01);
(Continued)

(58) Field of Classification Search
CPC ......... B01L 3/502738; B01L 3/502715; B01L 2300/123; B01L 3/502707;
(Continued)

(56) References Cited

U.S. PATENT DOCUMENTS 6,929,239 B1    8/2005    Colin et al.
7,378,280 B2 *  5/2008    Quake .................. F04B 43/043
                                                             436/63
(Continued)

FOREIGN PATENT DOCUMENTS

CN    102459565    5/2012
EP    2 008 718    12/2008
(Continued)

OTHER PUBLICATIONS

Tamaki—Pressure driven flow control system for nanofluidic chemical process—Journal of Chromatography A—2006 (Year: 2006).*
(Continued)

*Primary Examiner* — Benjamin R Whatley
*Assistant Examiner* — Jean Caraballo-Leon
(74) *Attorney, Agent, or Firm* — Oblon, McClelland, Maier & Neustadt, L.L.P.

(57) ABSTRACT

A nano-fluidic device includes: a first substrate that has a nanoscale groove on one surface; and a second substrate that is integrally provided with the first substrate by bonding one surface of the second substrate to the one surface of the first substrate and forms a nanochannel with the groove of the first substrate, in which either the first substrate or the second substrate includes at least a thin portion in a part of a position overlapping the nanochannel in plan view, and the thin portion is deformed by pressing to open and close the nanochannel.

23 Claims, 9 Drawing Sheets

(51) Int. Cl.
  *B82B 3/00* (2006.01)
  *G01N 35/08* (2006.01)
  *G01N 37/00* (2006.01)
  *B81B 1/00* (2006.01)
  *F16K 99/00* (2006.01)
(52) U.S. Cl.
  CPC ............ *B82B 1/001* (2013.01); *B82B 3/0019* (2013.01); *F16K 99/0015* (2013.01); *G01N 35/08* (2013.01); *G01N 37/00* (2013.01); B01L 3/502707 (2013.01); B01L 2200/06 (2013.01); B01L 2300/0887 (2013.01); B01L 2300/0896 (2013.01); B01L 2300/123 (2013.01); B01L 2400/0655 (2013.01); *F16K 2099/0084* (2013.01)
(58) Field of Classification Search
  CPC ..... B01L 2300/0887; B01L 2400/0655; B01L 2300/0896; B01L 2200/06; F16K 99/0015; F16K 2099/0084; B81B 1/00; G01N 37/00; G01N 35/08; B82B 3/0019; B82B 1/001
  See application file for complete search history.

(56) References Cited

U.S. PATENT DOCUMENTS

| | | | | |
|---|---|---|---|---|
| 8,123,192 | B2* | 2/2012 | Maltezos | F16K 99/0026 251/129.17 |
| 8,388,908 | B2* | 3/2013 | Blaga | F16K 99/0015 422/503 |
| 2004/0115838 | A1 | 6/2004 | Quake et al. | |
| 2004/0195539 | A1* | 10/2004 | Mead | F16K 99/0001 251/61 |
| 2005/0031494 | A1 | 2/2005 | Harms et al. | |
| 2006/0166357 | A1* | 7/2006 | Takayama | F16K 99/0026 435/289.1 |
| 2008/0289710 | A1* | 11/2008 | Unger | B01L 3/50273 137/833 |
| 2010/0159462 | A1 | 6/2010 | Takayama et al. | |
| 2010/0247384 | A1 | 9/2010 | Takayama et al. | |
| 2011/0120580 | A1 | 5/2011 | Takahashi et al. | |
| 2011/0240127 | A1 | 10/2011 | Eberhart et al. | |
| 2011/0305607 | A1* | 12/2011 | Jung | F16K 99/0026 422/502 |
| 2012/0177543 | A1* | 7/2012 | Battrell | B01F 11/0071 422/187 |
| 2012/0279638 | A1* | 11/2012 | Zhou | F16K 99/0057 156/196 |
| 2012/2898511 | | 11/2012 | Yamamoto | |
| 2014/0193896 | A1 | 7/2014 | Cohen et al. | |

FOREIGN PATENT DOCUMENTS

| | | |
|---|---|---|
| JP | 2003-525101 | 8/2003 |
| JP | 2009-511083 | 3/2009 |
| JP | 2009-168216 A | 7/2009 |
| JP | 2011-47708 A | 3/2011 |
| JP | 2011-524815 A | 9/2011 |
| JP | 2013-516582 | 5/2013 |
| JP | 2014-29327 A | 2/2014 |
| JP | 2014-240065 A | 12/2014 |
| WO | 2009/156045 A2 | 12/2009 |
| WO | 2009/156045 A3 | 12/2009 |
| WO | 2011/067961 A1 | 6/2011 |

OTHER PUBLICATIONS

International Search Report dated Dec. 6, 2016, in PCT/JP2016/081315, filed Oct. 21, 2016.

Unger, M.A. et al. "Monolithic Microfabricated Valves and Pumps by Multilayer Soft Lithography", Science, vol. 288, Apr. 7, 2000, pp. 113-116 (5 total pages).

Mawatari, K. et al., "Femtoliter Droplet Handling in Nanofluidic Channels: A Laplace Nanovalve", Analytical Chemistry, vol. 84, Dec. 7, 2012, pp. 10812-10816.

Extended European Search Report dated Apr. 11, 2019 in corresponding European Patent Application No. 16857569.4, 7 pages.

Office Action in corresponding Japanese Application No. 2017-545818, dated Jul. 7, 2020.

Office Action in corresponding Chinese Application No. 201680060895.5, dated May 7, 2020. (w/English Translation).

* cited by examiner

NANO-FLUIDIC DEVICE AND CHEMICAL ANALYSIS APPARATUS

TECHNICAL FIELD

The present invention relates to a nano-fluidic device and a chemical analysis apparatus.

BACKGROUND ART

In the related art, a microscale fine space is expected to be used in the field of diagnosis, analysis, or the like in order to realize a reduction in a mixing and reaction time, a significant reduction in the amount of a sample and reagent, a reduction in the size of a device, and the like. For example, a device in which a microchannel including a groove having a depth of several hundreds of micrometers or less is formed in a glass substrate (microchip) having a size of several square centimeters for integration of a chemical system is known.

One element device for integration of a chemical system is a device such as a valve capable of controlling fluid. By incorporating a valve into a device, a flow direction of fluid flowing through a micro channel can be regulated, or the flow of fluid can be controlled.

For example, Non-Patent Document 1 describes a device that opens and closes a microchannel using a shape change of dimethylpolysiloxane (PDMS), which is a soft polymer material.

In addition, for example, Patent Document 1 describes a fluid-controlling device including a microscale valve in which a glass substrate having a hollow portion is used and in which fluid can be controlled by changing the volume of the hollow portion.

However, recently, a nanoscale fine space having a smaller scale than a microscale fine space has been considered.

A nanoscale fine space is predominantly smaller than a single cell, and thus is also expected to be used as a single cell analysis device. For example, by analyzing protein or the like in one cell having a size of several tens of micrometers using an extended nanospace having a size of several tens to several hundreds of nanometers, which is predominantly smaller than a single cell, a unique function of each cell that has not been discovered using an average of multiple cells can be analyzed. In addition, for example, it is expected that cancer diagnosis can be performed using one cancer cell that has been initially developed.

Further, a device using a nanoscale fine space is expected to be used as an ultrahigh-sensitivity analysis tool.
This way, by using an extended nanospace, high-sensitivity and high-speed chromatography, immunoassay of a single molecule or a countable molecule (molecule having a size to be countable), or the like can be realized.

A nanoscale fine space in which an effect of a surface is predominant exhibits unique solution properties compared to a microscale fine space. Therefore, a new device using such unique solution properties has attracted attention.

Even in an innovative functional device using an extended nanospace having a size of several tens to several hundreds of nanometers, it has been requested to control fluid flowing through the inside of a nano channel. For example, Non-Patent Document 2 describes a stop valve using a Laplace pressure at a gas-liquid interface between a hydrophobic portion and a hydrophilic portion provided in a nanochannel.

CITATION LIST

Patent Literature

[Patent Document 1] Japanese Unexamined Patent Application, First Publication No. 2014-29327

Non-Patent Literature

[Non-Patent Document 1] Marc A Unger et al., Science, Vol. 288, pp. 113-116, 2000
[Non-Patent Document 2] K. Mawatari et al., Anal. Chem., 2012, 84, 10812-10816

SUMMARY OF INVENTION

Technical Problem

However, a nano-fluidic device that can control a nano-sized channel to be opened and closed has not been realized For example, a nano-sized channel can be prepared using soft PDMS or the like described in Non-Patent Document 1, but it is difficult to allow this channel to function as a valve that can be controlled to be opened and closed.

A nano-sized channel is narrower than a micro-sized channel. Therefore, an internal pressure applied to the nano-sized channel is high, and it is necessary to increase a pressure during opening and closing of the channel. However, in a case where soft PDMS or the like is used as a material constituting a channel, PDMS is deformed due to an internal pressure, and a designed shape of a nanochannel cannot be maintained. In addition, portions formed of PDMS may adsorb to each other due to excessively strong deformation during pressing, and a nanochannel cannot be maintained. That is, even in a case where soft materials such as PDMS is used for a nano-fluidic device that opens and closes a nanochannel, a sufficient effect cannot be obtained. In addition, a nano-fluidic device in which PDMS or the like is used as a material constituting a channel has a problem in that it cannot be used in an organic chemical process.

In addition, for example, the scale of a diaphragm valve structure used in the fluid-controlling device described in Patent Document 1 cannot be reduced to nanoscale. In the diaphragm valve described in Patent Document 1, the flow of fluid is controlled by forming a hollow portion on glass and changing the volume of the hollow portion. The hole diameter of the hollow portion in which the hollow portion can be controllably provided on glass is several tens to several hundreds of micrometers. That is, in a case where the hollow portion is applied to a nanoscale flow path, the valve cannot appropriately function due to an excessively large hole diameter. In addition, a configuration of providing a through-hole using a focused ion beam (FIB) to reduce a beam diameter to a size of several nanometers to several hundreds of nanometers can be considered. However, a hole that penetrates glass substrate cannot be formed by FIB processing.

On the other hand, the stop valve using a Laplace pressure described in Non-Patent Document 1 can control the flow of a nano-sized flow path. However, the stop valve using a Laplace pressure controls fluid by using a Laplace pressure generated by a liquid surface tension as a threshold. Therefore, the flow of fluid can be controlled only once, and it is difficult to freely control the flow of fluid multiple times.

The present invention has been made in consideration of the above-described circumstances, and an object thereof is to provide a nano-fluidic device in which a valve that can open and close a nanochannel is provided. Another object of the present invention is to provide a chemical analysis apparatus using the nano-fluidic device.

Solution to Problem

In order to achieve the object, the present invention adopts the following means.

(1) According to one aspect of the present invention, a nano-fluidic device is provided, including: a first substrate that has a nanoscale groove on one surface; and a second substrate that is integrally provided with the first substrate by bonding one surface of the second substrate to the one surface of the first substrate and forms a nanochannel with the groove of the first substrate, in which either the first substrate or the second substrate includes at least a thin portion in a part of a position overlapping the nanochannel in plan view, and the thin portion is deformed by pressing to open and close the nanochannel.

(2) In the nano-fluidic device according to (1), a thickness of the thin portion may be 10 mm or less.

(3) In the nano-fluidic device according to (1) or (2), a width of the thin portion in a direction in which the nanochannel extends may be 2 µm to 100 µm.

(4) In the nano-fluidic device according to any one of (1) to (3), the nanochannel formed by the first substrate and the second substrate may include a channel portion that extends in one direction, and a valve operation region that is provided in a position overlapping the thin portion in plan view and has a wider width than the nanochannel.

(5) In the nano-fluidic device according to any one of (1) to (4), among the first substrate and the second substrate, a substrate that does not include the thin portion may include a protrusion portion that is provided in a position in the nanochannel facing the thin portion and with which the deformed thin portion comes into contact.

(6) In the nano-fluidic device according to any one of (1) to (5), among the first substrate and the second substrate, a substrate that does not include the thin portion may include a recessed portion that is provided in a position in the nanochannel facing the thin portion and has a shape conforming to a shape of the deformed thin portion.

(7) The nano-fluidic device according to any one of (1) to (6) may further include a pressing mechanism which is configured to perform the pressing.

(8) According to another aspect of the present invention, a chemical analysis apparatus is provided, including the nano-fluidic device according to any one of (1) to (7).

(8) According to still another aspect of the present invention, a chemical analysis apparatus is provided, including: the nano-fluidic device according to any one of (1) to (7); and two micro-fluidic devices that include a microchannel and are disposed such that the nano-fluidic device is interposed between the micro-fluidic devices, in which the nano-fluidic device and each of the two or more micro-fluidic devices are connected to each other by connecting the nanochannel and the microchannel to each other, and chemical analysis is performed using the nano-fluidic device.

Advantageous Effects of Invention

In the nano-fluidic device according to the aspect of the present invention, the nanochannel can be freely opened and closed, and fluid flowing through the nanochannel can be controlled.

DESCRIPTION OF EMBODIMENTS

Hereinafter, a configuration of the present invention will be described using the drawings. In the drawings used for the following description, characteristic portions are enlarged and shown for convenience of easy understanding of characteristics, but dimensional ratios and the like of respective components are not necessarily the same as the actual ones. In the following description, materials, dimensions, and the like are merely exemplary, and the present invention is not limited thereto. Within a range not departing from the scope of the present invention, appropriate modifications can be made.

(Nano-Fluidic Device)

Figure 1:
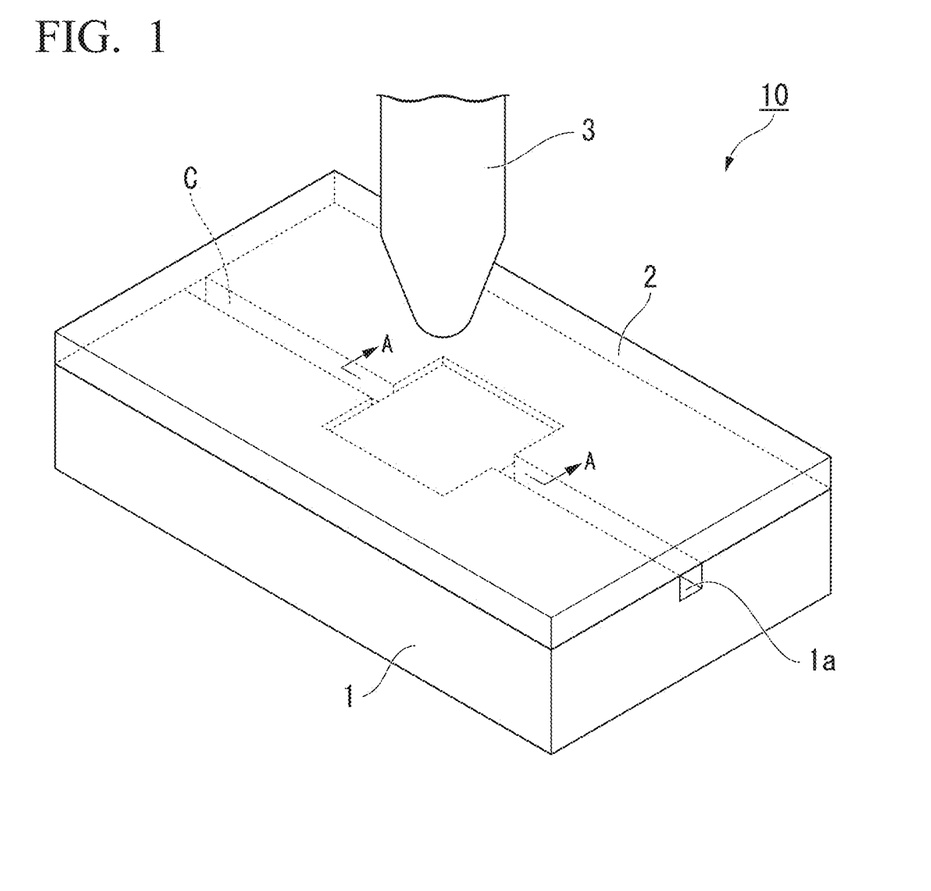
FIG. 1 is a perspective view schematically showing a nano-fluidic device according to an embodiment of the present invention.

FIG. 1 is a perspective view showing a nano-fluidic device according to an aspect of the present invention. The nano-fluidic device 10 includes: a first substrate 1 that includes a groove 1a; and a second substrate 2 that is bonded to the first substrate 1. In an aspect where the nano-fluidic device 10 is used, an actuator (pressing mechanism) 3 that presses a predetermined position of the nano-fluidic device 10 is provided in the nano-fluidic device 10.

The nano-fluidic device 10 includes a nanochannel C that is formed by bonding the first substrate 1 and the second substrate 2 to each other. The nanochannel C is formed by the groove 1a of the first substrate 1 and one surface of the second substrate 2.

Figure 2:
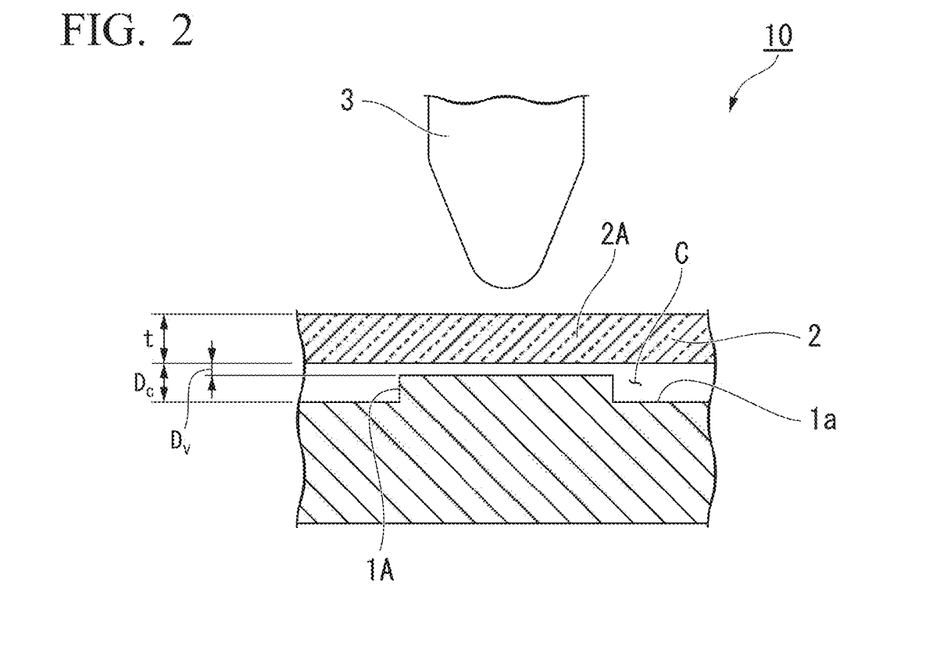
FIG. 2 is a cross-sectional view (taken along line A-A of FIG. 1) schematically showing the nano-fluidic device according to the aspect of the present invention.

FIG. 2 is a diagram schematically showing a cross-section (taken along line A-A of FIG. 1) of the nano-fluidic device according to the aspect of the present invention. As shown in FIG. 2, a thin portion 2A is provided on a surface of the second substrate 2 that is pressed by the actuator 3. In the nano-fluidic device 10 shown in FIG. 2, the entire area of the second substrate 2 is thinned to form the thin portion 2A. The thin portion 2A is a portion that is deformed by the pressing of the actuator 3, and is an operation portion of a valve.

A protrusion portion 1A is provided in a position of the first substrate 1 in which the thin portion 2A is not provided, that is, the position facing the thin portion 2A. The thin portion 2A deformed by the pressing of the actuator 3 comes into contact with the protrusion portion 1A such that the nanochannel C is closed. That is, in the nano-fluidic device 10, the nanochannel C can be opened and closed by the pressing of the actuator 3.

The thickness of the thin portion 2A varies depending on a pressure at which the thin portion 2A is pressed, the hardness of the second substrate 2, and the like. In a case where an operation amount in which the thin portion 2A and the protrusion portion 1A come into contact with each other by the pressing of the actuator 3 is sufficiently small, the thickness of the thin portion 2A may be about 10 mm. However, the thickness of the thin portion 2A is preferably 100 μm or less and more preferably 10 μm or less. In addition, the thickness of the thin portion 2A is preferably 100 nm or more.

In a case where the thickness of the thin portion 2A is in the above-described range, the thin portion 2A can be deformed by the pressing without being fractured.

The pressure at which the actuator 3 presses the thin portion 2A varies depending on the Young's modulus of a material constituting the nano-fluidic device, the thickness thereof, the area of a pressed portion, and the like. However, it is necessary that the actuator 3 press the thin portion 2A at a pressure that is equal to or higher than the internal pressure of the nanochannel. The pressure is preferably $10^6$ Pa or higher, more preferably $10^7$ Pa or higher, and still more preferably $10^9$ Pa or higher.

Figure 3:
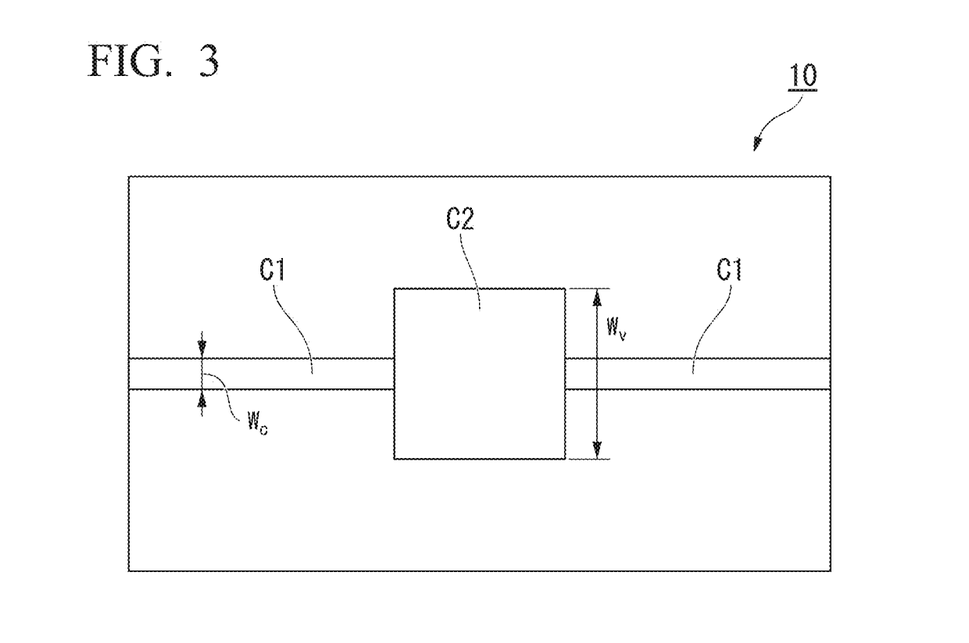
FIG. 3 is a plan view schematically showing the nano-fluidic device according to the aspect of the present invention.

FIG. 3 is a plan view schematically showing the nano-fluidic device according to the aspect of the present invention. The nanochannel C provided in the nano-fluidic device 10 shown in FIG. 3 includes a channel portion C1 and a storage portion C2. The channel portion C1 is a channel through which fluid flows from a supply side to a discharge side. The storage portion C2 stores fluid when the fluid is dammed by the pressing of the actuator 3. The storage portion C2 also functions as an operation region where the thin portion 2A, which is the operation portion of a valve, can operate. By providing the storage portion C2, a rapid change in flow path resistance caused when fluid is dammed can be avoided.

At least either a depth or a width of the nanochannel C is an extended nano-size. The extended nano-size refers to a size in a range of 10 nm to 1000 nm. The extended nano-size is smaller than a single cell having a size of several tens of micrometers. Therefore, small amount of proteins in one cell can be caused to flow in a state where they are separated from each other. In addition, the nanochannel C has an extremely small spatial volume in a range of several attoliters to several femtoliters, and the amount of fluid supplied to the nanochannel C can be made to be extremely small.

In the nanochannel C, a depth $D_c$ of the channel C1 is preferably 10 nm to 1000 nm, more preferably 100 nm to 600 nm, and still more preferably 300 nm to 500 nm. A width $W_c$ of the channel C1 is preferably 10 nm to 1000 nm, more preferably 500 nm to 1000 nm, and still more preferably 700 nm to 900 nm. In a case where the channel portion C1 is in the above-described range, the channel portion C1 can be processed with high processing accuracy, and cell can be prevented from flowing into the channel C1 at the same time.

The volume of the storage portion C2 of the nanochannel C is preferably several picoliters or less, and it is preferable that the volume of the storage portion C2 satisfy the following Relational Expression (1).

$$\frac{W_v^2 D_v}{W_v W_c D_c} < 10 \qquad (1)$$

In a case where the volume of the storage portion C2 is extremely large with respect to the volume of fluid supplied from the nanochannel C1 having the extended nano-size, the storage portion C2 is not filled with the fluid flowing into the storage portion C2, and a dead space is formed therein. As a result, even in a state where the nanochannel C is not closed, fluid may flow out to the discharge side of the nanochannel C, and the fluid controllability of the nano-fluidic device 10 deteriorates.

As described above, the nanochannel C has the extended nano-size. That is, the volume of fluid flowing through the inside of the flow path is in a range of several attoliters to several femtoliters. In a case where the volume of the storage portion C2 is several picoliters or less, the formation of a dead space in the storage portion C2 is prevented, and the retention of fluid in the storage portion C2 can be prevented.

In addition, Expression (1) shows conditions under which a dead space is not likely to be formed. A numerator of Expression (1) represents the volume of the storage portion C2. On the other hand, a denominator of Expression (1) represents the volume of the channel portion C1 in a region at a distance of a width $W_v$ of the storage portion C2 from a boundary between the storage portion C2 and the channel portion C1 to the channel portion C1 side. That is, the denominator represents the approximate volume of fluid that flows through the storage portion C2 when the fluid flows into the nanochannel C. In a case where the volume of the storage portion C2 is excessively large with respect to the amount of the fluid flowing into the nanochannel C, a dead space is likely to be formed. In order to avoid the formation of a dead space and to prevent fluid convection in the storage portion C2, the left side of Expression (1) is preferably less than 10, more preferably less than 5, and still more preferably less than 3.

A depth $D_v$ and the width $W_v$ of the storage portion C2 can be appropriately set such that the volume of the storage portion C2 satisfies the above-described relationship.

The depth of the storage portion C2 is preferably 10 nm to 1000 nm, more preferably 20 nm to 300 nm, and still more preferably 50 nm to 200 nm.

In a case where the depth of the storage portion C2 is large, the shape displacement of the thin portion 2A is large. In this case, it is necessary to increase the pressure at which the thin portion 2A is pressed, and the thin portion 2A is likely to be fractured. On the other hand, in a case where the depth of the storage portion C2 is excessively small, the effect of the surface roughness of glass is large. Depending on the surface state of glass, the fluid controllability deteriorates.

The width $W_v$ of the storage portion C2 can be calculated back from the depth $D_v$ of the storage portion C2 and conditions of the volume of the storage portion C2. Specifically, the width $W_v$ of the storage portion C2 is preferably 2 µm to 100 µm, more preferably 10 µm to 50 µM, and still more preferably 20 to 40 µm. In a case where the width $W_v$ of the storage portion C2 is in the above-described range, the formation of a dead space in the storage portion C2 can be avoided. It is preferable that the width of the storage portion C2 match the width of the thin portion 2A in a direction in which the nanochannel C extends.

In addition, in the above description, from the viewpoint of the volume of the storage portion C2, the preferable ranges of the depth $D_V$ and the width $W_V$ of the storage portion C2 are defined. On the other hand, from the viewpoint that the storage portion C2 functions as the operation region with respect to the operation portion of a valve, the preferable ranges of the depth $D_v$ and the width $W_v$ of the storage portion (operation region) C2 can also be determined.

In order to reduce a curvature of the thin portion (valve operation portion) 2A when the thin portion 2A as the operation portion of a valve is pressed, it is preferable that the width $W_v$ of the storage portion (operation region) C2 be wide. Specifically, the width $W_v$ of the storage portion (operation region) C2 is preferably 2 µm or more and more preferably 10 µm or more.

In addition, in order to reduce the shape displacement of the thin portion (valve operation portion) 2A during pressing, it is preferable that the depth $D_v$ of the storage portion (operation region) C2 be shallow. Specifically, the depth $D_v$ of the storage portion (operation region) C2 is preferably 10 nm or more and is preferably 1 µm or less.

A material used in the first substrate 1 and the second substrate 2 is not particularly limited as long as it has sufficient rigidity for forming the nanochannel C and maintaining the shape. Regarding the rigidity for forming the nanochannel C and maintaining the shape, for example, the Young's modulus is preferably $10^7$ Pa or higher, more preferably $10^9$ Pa or higher, and still more preferably $10^{10}$ Pa or higher.

Specifically, the first substrate 1 and the second substrate 2 can be formed of, for example, glass, silicon, ceramic, acryl, polycarbonate (PC), polyphenylene sulfide (PPS), polyether ether ketone (PEEK), polyacetal (POM), polyethylene terephthalate (PET), or polybutylene terephthalate (PET). For example, the Young's modulus of glass, silicon, or ceramic is $10^{10}$ to $10^{11}$ Pa. For example, the Young's modulus of polycarbonate is $10^6$ Pa. PDMS has a Young's modulus of $10^6$ Pa and is soft. A soft material is presumed to be deformed by the internal pressure of fluid flowing through the inside of the flow path, and thus is not preferable.

In addition, in consideration of the use in an organic chemical process, it is preferable that an inorganic material such as glass, silicon, or ceramic be used. From the viewpoint of easy manufacturing of the nano-fluidic device 10, it is preferable that glass, silicon, or the like be used. Using this material, the nanochannel C can be formed by low-temperature bonding described below.

Figure 4:
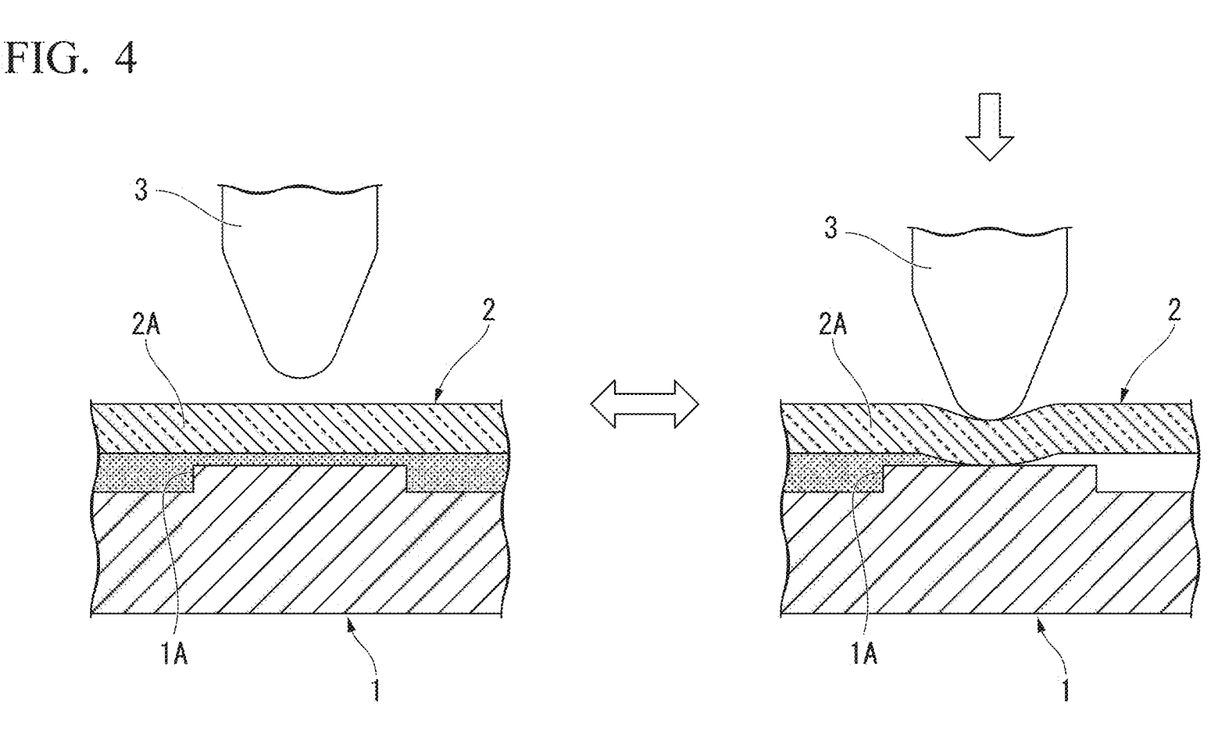
FIG. 4 is a cross-sectional view schematically showing a function of the nano-fluidic device according to the aspect of the present invention.

FIG. 4 is a cross-sectional view schematically showing a function of the nano-fluidic device according to the aspect of the present invention. As shown on the left side of FIG. 4, in a case where the actuator 3 does not press the second substrate 2, the nanochannel C is open. Therefore, fluid flows through the inside of the nanochannel C.

On the other hand, as shown on the right side of FIG. 4, in a case where the actuator 3 presses the second substrate 2, the thin portion 2A of the second substrate 2 is deformed. By the deformed thin portion 2A and the protrusion portion 1A of the first substrate 1 coming into contact with each other, the nanochannel C is closed, and the flow of fluid in the nanochannel C is interrupted.

A change rate in flow path resistance before and after the opening and closing of the nanochannel C is preferably 10 times or more, more preferably 30 times or more, and still more preferably 50 times or more. The flow path resistance being high represents that fluid is not likely to flow through the inside of the nanochannel C. Conversely, the flow path resistance being low represents that fluid is likely to flow through the inside of the nanochannel C.

That is, the change rate in flow path resistance being high represents that fluid is not likely to flow in a state where the nanochannel C is closed and that fluid is likely to flow in a state where the nanochannel C is open. In a case where the change rate in flow path resistance is in the above-described range, once the nanochannel C is opened, fluid can be caused to flow to the discharge side. Therefore, response characteristics of the nano-fluidic device 10 can be improved.

As described above, the nano-fluidic device 10 according to the aspect of the present invention is pressed by the actuator 3 or the pressing is stopped such that the nanochannel C can be freely opened and closed.

It has been considered that, in a case where the rigidity of a base material constituting a channel is high, the channel cannot be opened and closed using a mechanical force of the actuator 3 or the like. The reason for this is that the displacement of the base material having a high rigidity is small with respect to the pressure to be pressed. Therefore, in a microchannel or the like, in general, PDMS or the like having a low rigidity is used.

On the other hand, in order to form the nanochannel C, a base material having a high rigidity is required due to processing accuracy. That is, the mechanical opening and closing of the flow path has not been reported. However, in the nano-fluidic device 10 according to the aspect of the present invention, the nanochannel C itself is an extremely small flow path having an extended nano-size, and a sufficient displacement can be secured using a base material having a high rigidity. As a result, the nano-fluidic device 10 according to the aspect of the present invention can freely open and close the nanochannel C using a mechanical force.

Hereinabove, the nano-fluidic device 10 according to the embodiment of the present invention has been described with reference to the drawings. However, within a range not departing from the scope of the present invention, various modifications can be made to the respective configurations.

Figure 5:
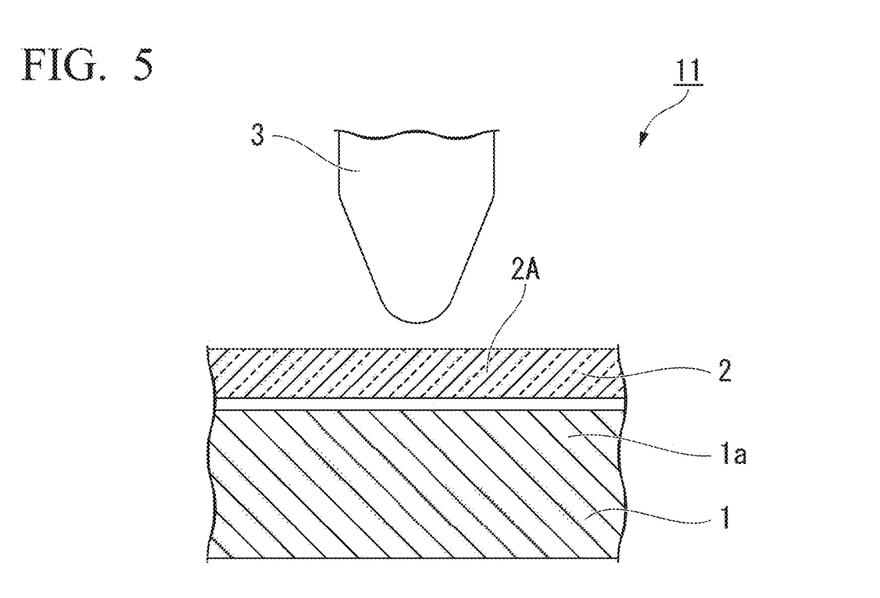
FIG. 5 is a cross-sectional view schematically showing a modification example of the nano-fluidic device according to the aspect of the present invention.

For example, as in a nano-fluidic device 11 shown in FIG. 5, the depth of the nanochannel C may be set to be constant without providing the protrusion portion on the first substrate 1. In addition, a configuration in which the storage portion C2 of the nanochannel C shown in FIG. 3 is not provided may be adopted. That is, a configuration in which the actuator 3 is provided on the nanochannel C extending in one direction and presses the nanochannel C may be configured. According to this configuration, the nanochannel C can be easily processed.

Figure 6:
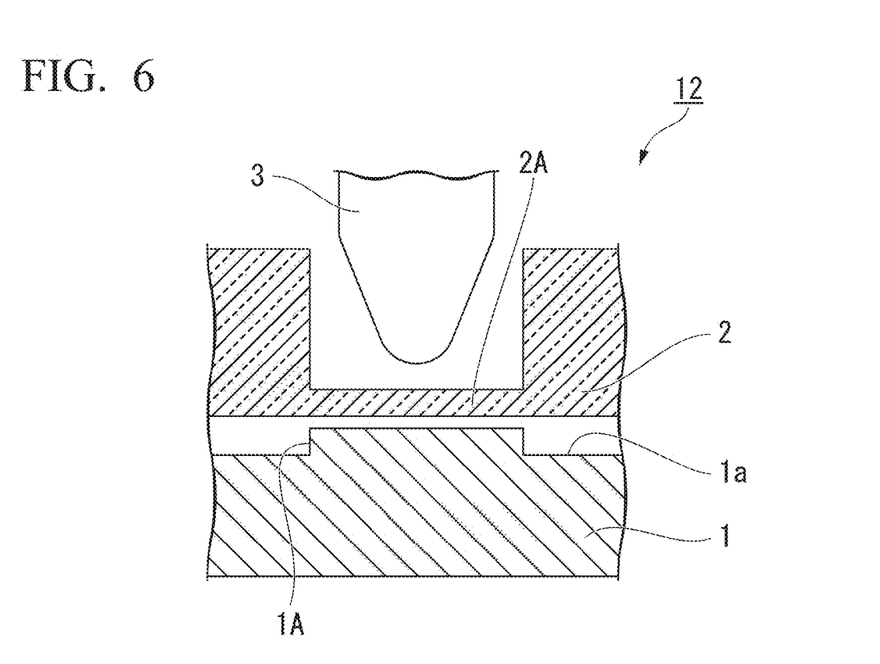
FIG. 6 is a cross-sectional view schematically showing a modification example of the nano-fluidic device according to the aspect of the present invention.

In addition, as in a nano-fluidic device 12 shown in FIG. 6, a configuration in which the thin portion 2A is formed only in a portion of the second substrate 2 that is pressed by the actuator 3 may be adopted. This way, by forming only a portion of the second substrate 2 where shape displacement by pressing is required to be thin and forming the other portions of the second substrate 2 to be thick, even in a case where an external force is applied to the nano-fluidic device 12, the nano-fluidic device 12 can be prevented from being fractured.

In this case, it is preferable that the width of the second substrate 2 in which the thin portion 2A is provided (the width in a direction the nanochannel extends) be 2 to 100 µm. By adjusting the width of the thin portion 2A to be in the above-described range, the thin portion 2A can be provided only in the portion pressed by the actuator 3, and the fracture of the nano-fluidic device 12 can be further suppressed.

Figure 7:
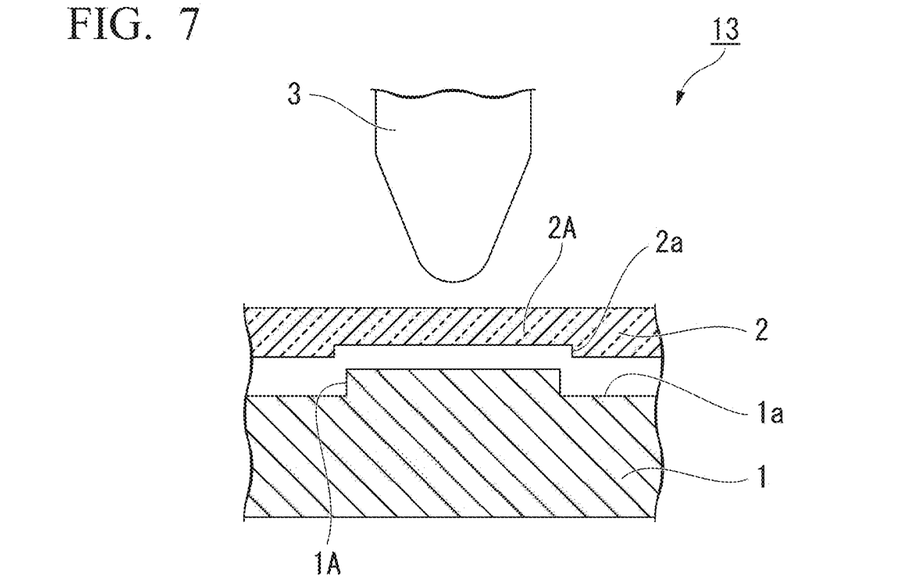
FIG. 7 is a cross-sectional view schematically showing a modification example of the nano-fluidic device according to the aspect of the present invention.

In addition, in FIG. 1, the groove 1a is provided only in the first substrate 1. However, as in a nano-fluidic device 13 shown in FIG. 7, a groove 2a corresponding to the groove 1a may also be provided in the second substrate 2. In this case, the groove 1a of the first substrate 1 and the groove 2a of the second substrate 2 form the nanochannel C.

Figure 8:
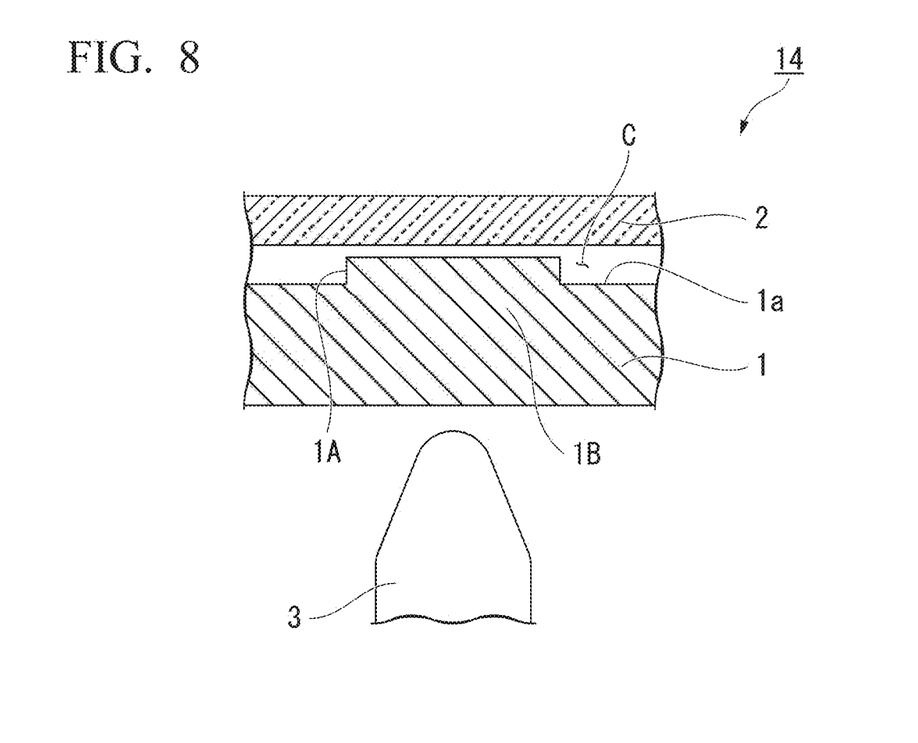
FIG. 8 is a cross-sectional view schematically showing a modification example of the nano-fluidic device according to the aspect of the present invention.

In addition, in the examples shown in FIG. 2, the actuator 3 is provided on the second substrate 2 side. However, as in a nano-fluidic device 14 shown in FIG. 8, the actuator 3 may press the first substrate 1. In this case, a portion of the first substrate 1 that is pressed by the actuator 3 is required to be deformed, and thus forms a thin portion 1B. A portion of the first substrate 1 other than the thin portion 1B may be thinner or thicker than the thin portion 1B.

In addition, the shape of the storage portion (operation region) C2 of the nanochannel C is not limited to a rectangular shape shown in FIG. 3, and may be an arbitrary shape. For example, as in a nano-fluidic device 16 shown in FIG. 9, the shape of the storage portion (operation region) C2 may be a circular shape in plan view. In a case where the shape of the storage portion C2 is a circular shape in plan view, the pressing of the actuator 3 is uniformly distributed in the storage portion C2.

Figure 9:
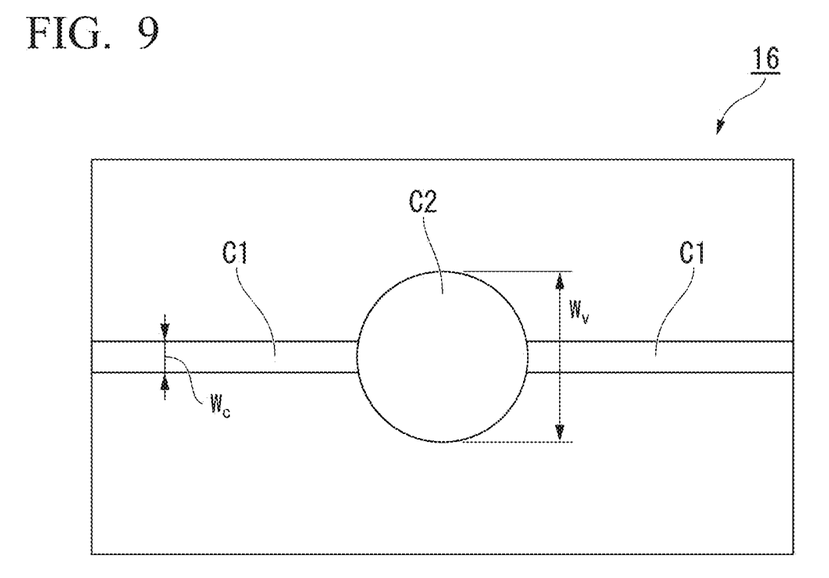
FIG. 9 is a plan view schematically showing the nano-fluidic device according to the aspect of the present invention.

In a case where the shape of the storage portion C2 is a circular shape, the width of the storage portion C2 refers to the diameter of the storage portion C2. It is preferable that the volume of the storage portion C2 of the nanochannel C satisfy the following Relational Expression (2).

$$\frac{\pi(W_v/2)^2 D_v}{W_v W_c D_c} < 10 \quad (2)$$

Figure 10:
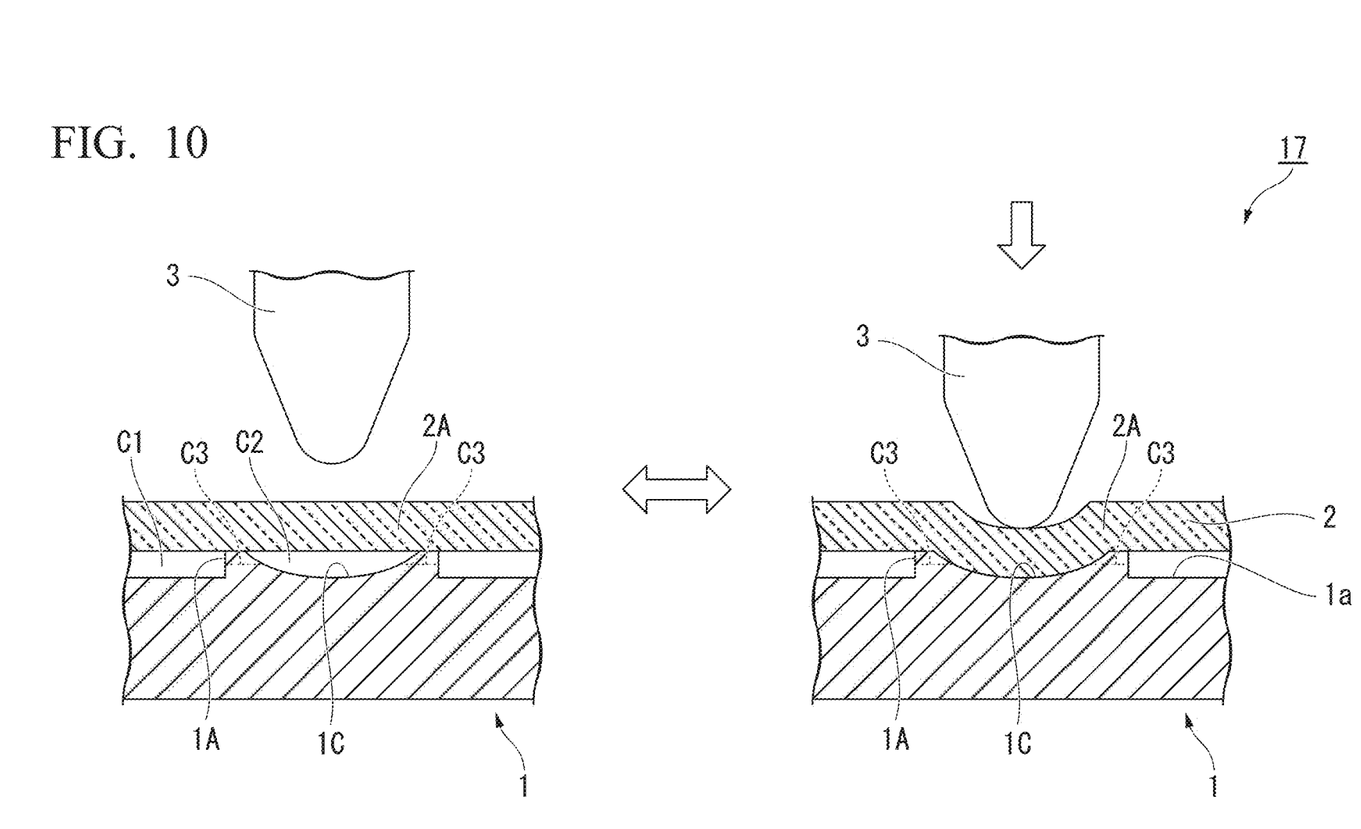
FIG. 10 is a cross-sectional view schematically showing a function of the nano-fluidic device according to the aspect of the present invention.

In addition, as in a nano-fluidic device 17 shown in FIG. 10, a recessed portion 1C that has a shape conforming to the shape of the deformed thin portion may be provided in a position facing the thin portion 2A in the nanochannel C.

FIG. 10 is a cross-sectional view schematically showing a function of the nano-fluidic device 17 according to the aspect of the present invention. As shown on the left side of FIG. 10, in a case where the actuator 3 does not press the second substrate 2, the channel portion C1 and the storage portion (operation region) C2 are connected through a connection path C3 to cause fluid to flow. The connection path C3 is a groove that is provided in the protrusion portion 1A of the first substrate 1 and that connects the channel portion C1 and the storage portion (operation region) C2.

On the other hand, as shown on the right side of FIG. 10, in a case where the actuator 3 presses the second substrate 2, the thin portion 2A of the second substrate 2 is deformed. The deformed thin portion 2A and the recessed portion 1C come into surface contact with each other. In a case where the thin portion 2A and the recessed portion 1C come into surface contact with each other, fluid cannot move forward from the connection path C3, and a valve is closed. The surface contact has higher adhesion than point contact. For example, as in the case of point contact shown in FIG. 4, fluid may leak through a gap around a pressing point pressed by the actuator 3. However, by adopting surface contact, this fluid leakage can also be prevented.

(Chemical Analysis Apparatus)

Figure 11:
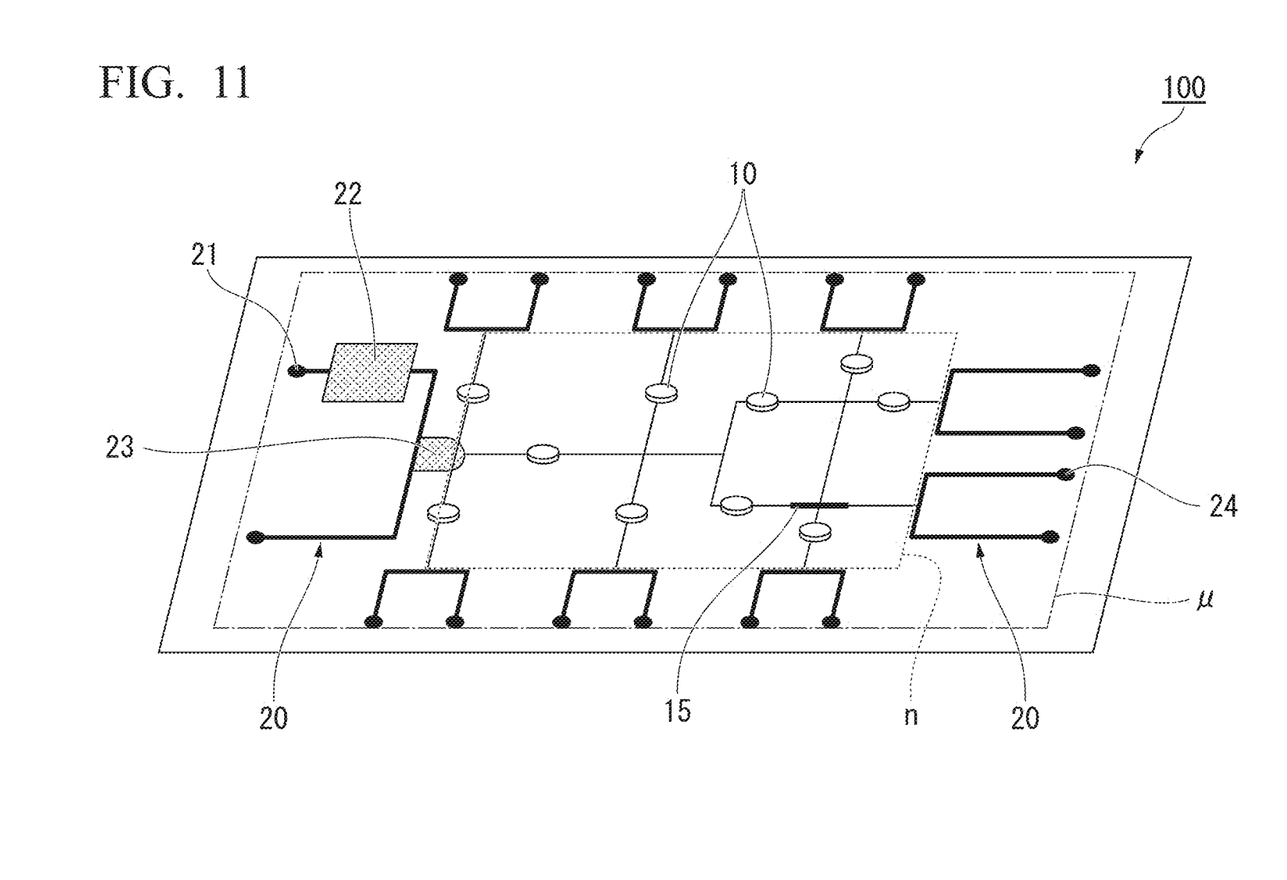
FIG. 11 is a perspective view schematically showing a chemical analysis apparatus according to an aspect of the present invention.

A chemical analysis apparatus according to an aspect of the present invention includes the above-described nano-fluidic device. FIG. 11 is a perspective view schematically showing a chemical analysis apparatus 100 according to an aspect of the present invention. The chemical analysis apparatus 100 includes: the above-described nano-fluidic device 10; and two or more micro-fluidic devices 20 that include a microchannelh and are disposed such that the nano-fluidic device 10 is interposed between the micro-fluidic devices 20. The nano-fluidic device 10 and each of the two or more micro-fluidic devices 20 are connected to each other by connecting the nanochannel and the micro-channel to each other.

As shown in FIG. 11, the chemical analysis apparatus 100 includes: a microscale region µ that is formed of the micro-fluidic device 20; and a nanoscale region n that includes the nano-fluidic device 10.

As a configuration of the micro-fluidic device 20, a well-known configuration can be used. For example, as shown in FIG. 11, the micro-fluidic device 20 may include: a temporary storage region 22 in which a sample injected from an injection port 21 is temporarily stored; and a disintegration region 23 where a cell transported from the temporary storage region 22 is disintegrated. Means for disintegrating a cell in the disintegration region 23 is not particularly limited. A configuration in which a pillar or the like is provided in a flow path to disintegrate a cell flowing along with the flow of fluid may be adopted.

In FIG. 11, the microscale region µ functions to connect the nanoscale region n to a microscale region where a person performs an operation. For example, on a microscale, a person injects a sample such as a cell disintegrated in a test tube from the injection port 21. The injected sample flows through the microchannel and is stored in the temporary storage region 22. One cell in the temporary storage region 22 is selected using optical tweezers or the like and is transported to the disintegration region 23. The transported cell is disintegrated in the disintegration region 23 and is supplied to the nanoscale region n. According to the above-described procedure, the microscale region µ can be connected to the nanoscale region.

The sample supplied to the nanoscale region n including the nano-fluidic device 10 according to the above-described procedure is provided for various measurements in the nanoscale region. In the nanoscale region n, the spatial volume is predominantly smaller than one cell having a size of several tens of micrometers, and thus a unique function of each cell that has not been discovered using an average of multiple cells can be analyzed. In addition, the nanochannel is a size-controlled space and has an extremely large specific surface area. Therefore, a highly effective separation operation using chromatography, or detection of a single molecule or a countable molecule (molecule having a size to be countable) using immunoassay can be performed.

For example, a predetermined functional device 15 is provided in a predetermined portion of the nanoscale region n. As the functional device 15, an appropriate device for immunoassay or chromatography can be provided.

As shown in FIG. 11, fluid including the sample supplied from the microscale region µ to the nanoscale region n flows through the nanochannel and reaches the functional device 15. At this time, before the functional device 15, a plurality of the nano-fluidic devices 10 according to the aspect of the present invention are provided. The nano-fluidic device 10 according to the aspect of the present invention functions as a valve. Therefore, by opening and closing the nano-fluidic device 10, the flow path through which fluid flows can be regulated. In addition, a timing at which fluid is supplied to the functional device 15 can be controlled.

In addition, in FIG. 11, only one functional device 15 is provided. However, a plurality of functional devices 15 may be provided so as to realize the chemical analysis apparatus 100 capable of regulating the flow path using the nano-fluidic device 10 according to the use and performing various kinds of analysis using one element.

The sample that has undergone various measurements in the nanoscale region n is transported again to the microscale region µ, and then is transported from a discharge port 24 on a macroscale.

As described above, by using the chemical analysis apparatus according to the aspect of the present invention, a device capable of performing various kinds of analysis at once according to the use can be realized. In addition, a timing at which a sample is supplied to a predetermined functional device can also be controlled, and higher-accuracy analysis can be performed.

(Method of Manufacturing Chemical Analysis Apparatus and Nano-Fluidic Device)

A method of manufacturing the chemical analysis apparatus according to the aspect of the present invention includes: a step of forming a groove on one surface of the first substrate and/or the second substrate; a step of imparting a predetermined function to a portion in the formed groove; a step of reducing the thickness of a predetermined position of the second substrate 2; a step of fluoridating a bonding surface of the first substrate and/or the second substrate to adjust hydrophilicity; and a step of bonding the first substrate and the second substrate to each other to form a nanochannel. The method of manufacturing the chemical analysis apparatus and the nano-fluidic device will be described below in more detail using FIGS. 1 to 11.

First, the first substrate 1 and the second substrate 2 are prepared. The groove 1a is formed in the prepared first substrate 1. A method of forming the groove 1a is not particularly limited. For example, the groove 1a can be formed on the surface of the substrate by appropriate means such as laser processing or etching while appropriately adjusting the size thereof. In addition to the groove 1a that forms the nanochannel C of the nano-fluidic device 10 according to the aspect of the present invention, a groove is also formed in a portion that forms the functional device 15 or a portion that forms another nanochannel. For example, in a case where a Mach-Zehnder element is used as the functional device, a groove branched into two parts is formed.

Next, a predetermined function is imparted to a part in the formed groove. For example, in a case where the chemical analysis apparatus is used for immunoassay, an antibody is provided in a portion that forms the functional device 15. In addition, a device corresponding to the imparted function is provided in the groove.

Next, the thickness of the second substrate 2 is reduced. As shown in FIG. 1, in a case where the entire area of the second substrate 2 is thin, a commercially available thin-layer glass can be purchased. In a case where the thickness of only a predetermined position is reduced as shown in FIG. 6, the thickness can be reduced by laser processing, etching, or the like as in the method of forming the groove 1a.

Next, among the first substrate and the second substrate to be bonded to each other, a bonding surface of at least one substrate is fluoridated to adjust hydrophilicity.

In the step of adjusting hydrophilicity, the bonding surface of the substrate is fluoridated. For the fluoridation, various methods can be used. For example, the fluoridation can be realized by supplying fluorine (for example, tetrafluoromethane: $CF_4$) during irradiation of oxygen plasma. At this time, oxygen plasma conditions may be, for example, irradiation of oxygen pressure: 60 Pa, 250 W, and 40 seconds. In addition, regarding the degree of hydrophilization, it can be considered that hydrophilization is sufficiently performed as long as a water contact angle on the fluoridated surface is 10° to 50°. In a case where the water contact angle is in the above-described range, the bonding strength after bonding can be made to be 0.5 $J/m^2$ or higher, and a sufficient bonding strength can be obtained.

Finally, the first substrate 1 and the second substrate 2 are bonding to each other such that the fluoridated surface is the bonding surface. By using the above-described method, the first substrate 1 and the second substrate can be bonding to each other at a low temperature, and damage caused by heat can be avoided.

The heating temperature during bonding is preferably 25° C. to 400° C. and more preferably a normal temperature or a temperature similar to a normal temperature (25° C. to 100° C.). In a case where the heating temperature is in the above-described range, damage to the antibody and the like provided for the functional device 15 can be reduced. In the case of substrate bonding using a method such as thermal fusion bonding, the temperature is 1000° C. or higher. Therefore, in a case where surface modification is performed in the device, damage to the surface-modified antibody and the like increases.

The pressing pressure during bonding is preferably 1000 N to 5000 N and more preferably 4000 N to 5000 N. In a case where the pressing pressure is lower than 1000 N, a sufficient bonding strength cannot be maintained. In a case where a sufficient bonding strength is not obtained, a portion of a sample passing through the bonding surface may leak. On the other hand, in a case where the pressing pressure is higher than 5000 N, the substrate may be damaged.

In addition, the pressing time is preferably 1 hour to 10 hours and more preferably 9 hours to 10 hours. In a case where the pressing time is in the above-described range, the bonding strength can be increased.

By performing the above-described steps, the nano-fluidic device and the chemical analysis apparatus including the nano-fluidic device and the functional device can be easily obtained. In addition, at this time, damage to the antibody and the like that exhibit predetermined functions can be avoided.

Hereinabove, the preferred embodiment of the present invention has been described in detail. However, the present invention is not limited to the specific embodiment, and various modifications and changes can be made within the scope of the present invention described in the claims.

EXAMPLES

Hereinafter, an example of the present invention will be described. The present invention is not limited to the following example.

Example 1

A nano-fluidic device having the same configuration as that shown in FIG. 1 was prepared. A configuration of a nanochannel is as follows.

Channel portion: depth=400 nm, width=900 nm
Storage portion: depth=100 nm, one side width=30 μm, volume=90 fL
Length from one end of channel portion to one end of storage portion side: 400 μm
Dead volume expressed on left side of Expression (1): 8.3 parts
Change in flow path resistance: 80 parts
Tip width of actuator: 10 μm
Material of first substrate and second substrate: glass
Thickness of second substrate (including thin portion): 10 μm Microchannels are formed in opposite ends of a supply port and a discharge port of the nano-fluidic device, respectively, and a fluorescent solution is supplied at a pressure of 20 kPa by a pressure controller.

Figure 12:
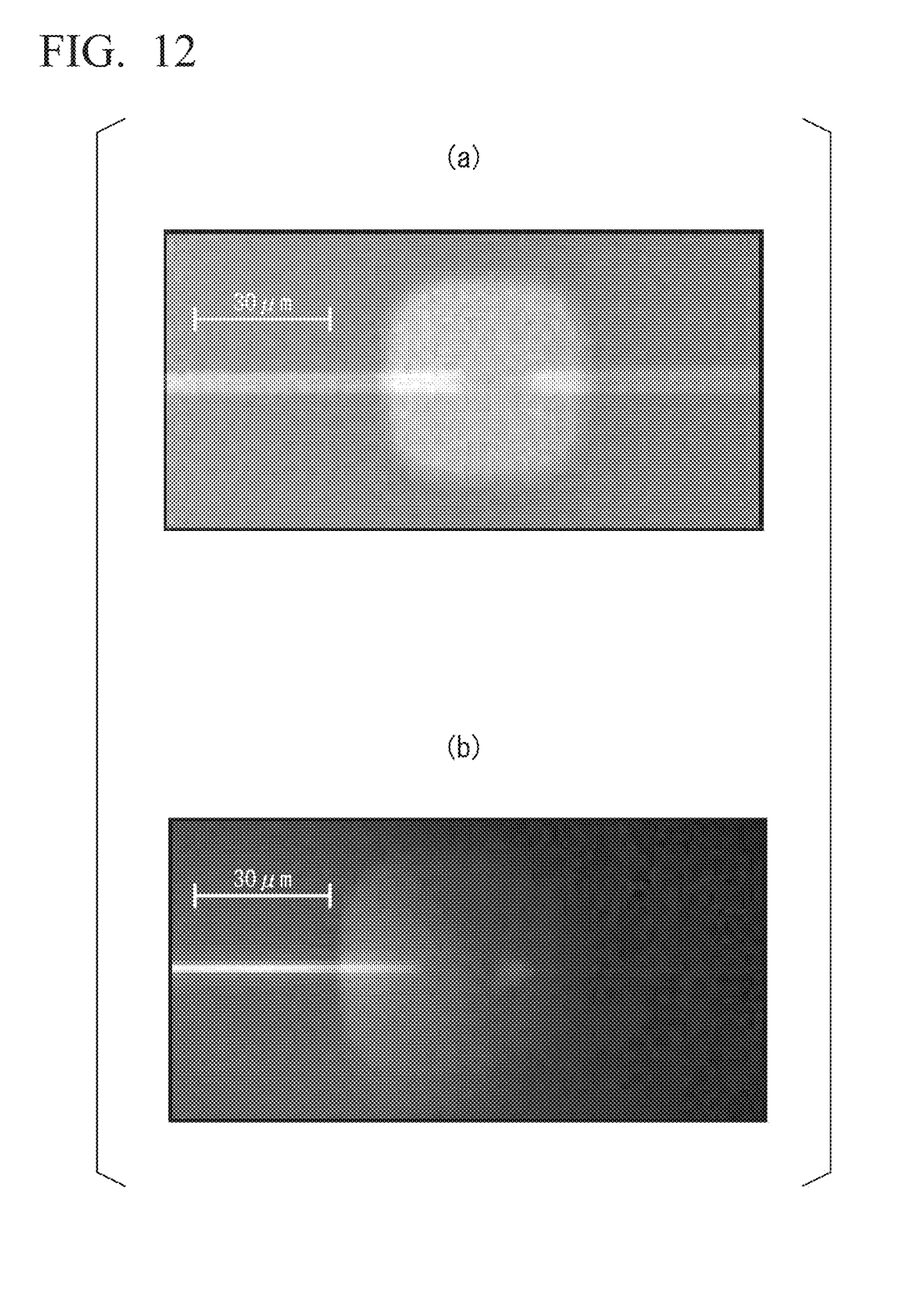
FIG. 12 is a microscopic image before and after opening and closing a nanochannel by introducing a fluorescent solution into a fluid device according to Example 1 and operating an actuator.

FIGS. 12(a) and 12(b) are microscopic images before and after opening and closing the nanochannel by introducing the fluorescent solution into the fluidic device according to Example 1 and operating the actuator. FIG. 12(a) is a microscopic image showing a state where the actuator is not pressing the fluidic device, and FIG. 12(b) is a microscopic image showing a state where the actuator is pressing the fluidic device. The pressing of the actuator was performed assuming that 680 MPa was applied to the glass surface when the glass surface was pressed by 100 nm.

It can be seen that the entire area of the flow path in the nano-fluidic device is lighted in FIG. 12(a), whereas the right side is not lighted in FIG. 12(b). That is, it can be seen that, by changing the pressing of the actuator, the flow of the fluorescent solution could be controlled. That is, it can be seen that the nano-fluidic device functioned as a valve that controls the flow of fluid flowing through the inside of the nanochannel.

Reference Example 1

The displacement of thin-layer glass (manufactured by Nippon Electric Glass Co., Ltd.) having a thickness of 10 μm was measured. Regarding a measurement method, the thin-layer glass was disposed on glass having a hole with a diameter of 30 μm. The thin-layer glass disposed above the hole was pressed using an actuator having a tip diameter of 10 μm, and the displacement of the thin-layer glass with respect to the pressing was measured.

The displacement of the thin-layer glass with respect to the pressing increased, and when the displacement reached 2.5 μm, the thin-layer glass fractured. That is, it can be seen that, in a case where thin-layer glass having a thickness of 10 μm is used, the nanochannel can be opened and closed without the thin-layer glass being fractured.

REFERENCE SIGNS LIST

1: FIRST SUBSTRATE
1a: GROOVE
1A: PROTRUSION PORTION
1C: RECESSED PORTION
2: SECOND SUBSTRATE
2A: THIN PORTION
3: ACTUATOR
10, 11, 12, 13, 14, 16, 17: NANO-FLUIDIC DEVICE
15: FUNCTIONAL DEVICE
20: MICRO-FLUIDIC DEVICE
21: INJECTION PORT
22: TEMPORARY STORAGE REGION
23: DISINTEGRATION REGION
24: DISCHARGE PORT
C: NANOCHANNEL
C1: CHANNEL PORTION
C2: STORAGE PORTION (OPERATION REGION)
C3: CONNECTION PATH
n: NANOSCALE REGION
μ: MICROSCALE REGION

The invention claimed is:

1. A nano-fluidic device, comprising:
a first substrate comprising a nanoscale groove and a protrusion on one surface, wherein the protrusion comprises an operation portion overlapping the nanoscale groove, wherein the operation portion comprises a concave recessed portion and a connection path, wherein the connection path is a groove that is provided in the operation portion of the first substrate, and
a second substrate that is integrally provided with the first substrate by bonding one surface of the second substrate to the one surface of the first substrate and forms a nanochannel with the nanoscale groove of the first substrate between the first and second substrates,
wherein the nanochannel comprises a channel portion that extends in one direction and further comprises the operation portion, wherein the channel portion comprises the nanoscale groove and the connection path, and wherein the channel portion and the concave recessed portion are connected by the connection path:
wherein:
the second substrate comprises a thin portion in a part of a position overlapping the nanochannel in plan view;
the operation portion comprises the concave recessed portion in a position facing the thin portion in the nanochannel and is provided in a position overlapping the thin portion in plan view and has a wider width than the channel portion,
the thin portion is deformed by pressing to close the nanochannel, wherein the thin portion conforms to the shape of the concave recessed portion of the nanochannel when the thin portion is deformed by pressing, wherein the thin portion does not protrude from the surface of the second substrate and is flat along the plane of the second substrate when not in a pressed state such that the nanochannel is open when the thin portion is not pressed;
a Young's modulus of the first substrate and the second substrate is $10^9$ Pa or higher,
a depth of the operation portion is 10 nm to 1000 nm, and a width of the operation portion is 2 μm or more.

2. The nano-fluidic device according to claim 1, wherein a thickness of the thin portion is 10 mm or less.

3. The nano-fluidic device according to claim 1, wherein a width of the thin portion in a direction in which the nanochannel extends is from 2 μm to 100 μm.

4. The nano-fluidic device according to claim 1, wherein the protrusion portion of the first substrate is provided in a position in the nanochannel facing the thin portion and with which the deformed thin portion comes into contact.

5. The nano-fluidic device according to claim 1, further comprising:
a pressing mechanism which is configured to perform the pressing.

6. The nano-fluidic device of claim 1, wherein a depth of the groove of the connection path is smaller than a depth of the nanoscale groove.

7. The nano-fluidic device according to claim 1, wherein all parts facing the nanochannel and the operation portion are formed of glass.

8. The nano-fluidic device according to claim 7, wherein the Young's modulus of glass is from $10^{10}$ to $10^{11}$ Pa.

9. The nano-fluidic device according to claim 1, wherein all parts facing the nanochannel and the operation portion are formed of an inorganic material.

10. The nano-fluidic device according to claim 9, wherein the Young's modulus of the inorganic material is from $10^{10}$ to $10^{11}$ Pa.

11. The nano-fluidic device according to claim 1, wherein a width of the nanochannel is from 10 nm to 900 nm.

12. An apparatus, comprising:
the nano-fluidic device according to claim 1.

13. An apparatus, comprising:
the nano-fluidic device according to claim 1; and
at least two micro-fluidic devices that comprise a microchannel and are disposed such that the nano-fluidic device is interposed between the micro-fluidic devices,
wherein the nano-fluidic device and each of the at least two micro-fluidic devices are connected to each other by connecting the nanochannel and the microchannel to each other, and
chemical analysis is performed using the nano-fluidic device.

14. A nano-fluidic device, comprising:
a first substrate comprising a nanoscale groove and a protrusion on one surface, wherein the protrusion comprises an operation portion overlapping the nanoscale groove; and
a second substrate that is integrally provided with the first substrate by bonding one surface of the second substrate to the one surface of the first substrate and forms a nanoscale channel with the nanoscale groove of the first substrate between the first and second substrates,
wherein:
the nanoscale channel comprises a first portion and a second portion, the second portion is configured to be deformed by pressing to close the nanoscale channel, wherein a thickness of the second portion is smaller than that of the first portion, and the nanochannel has a concave recessed portion, wherein the second portion conforms to the shape of the concave recessed portion when the second portion is deformed by pressing, wherein the second portion does not protrude from the surface of the second substrate and is flat along the plane of the second substrate when not in a pressed state such that the nanochannel is open when the second portion is not pressed,
and wherein a Young's modulus of the first substrate and the second substrate, which form the first portion and the second portion of the nanoscale channel, is $10^9$ Pa or higher,
the nanoscale channel comprises a channel portion that extends in one direction, and further comprises the operation portion that is provided in a position overlapping a thin portion of the second substrate in plan view and has a wider width than the channel portion,
a depth of the operation portion is 10 nm to 1000 nm,
a width of the operation portion is 2 µm or more.

15. The nano-fluidic device according to claim 14, wherein all parts facing the nanochannel and the operation portion are formed of an inorganic material.

16. The nano-fluidic device according to claim 14, wherein the Young's modulus of the first substrate and the second substrate, which form the first portion and the second portion of the nanoscale channel, is from $10^{10}$ to $10^{11}$ Pa.

17. A nano-fluidic device, comprising:
a first substrate comprising a nanoscale groove and a protrusion on one surface, wherein the protrusion comprises an operation portion overlapping the nanoscale groove; and
a second substrate that is integrally provided with the first substrate by bonding one surface of the second substrate to the one surface of the first substrate and forms a nanochannel with the groove of the first substrate between the first and second substrates,
wherein:
the second substrate comprises a thin portion in a part of a position overlapping the nanochannel in plan view;
the thin portion is deformed by pressing to close the nanochannel, wherein the nanochannel has a concave recessed portion and the thin portion conforms to the shape of the concave recessed portion when the thin portion is deformed by pressing, wherein the thin portion does not protrude from the surface of the second substrate and is flat along the plane of the second substrate when not in a pressed state such that the nanochannel is open when the thin portion is not pressed;
the nanochannel formed by the first substrate and the second substrate comprises a channel portion that extends in one direction, and further comprises the operation portion that is provided in a position overlapping the thin portion in plan view and has a wider width than the channel portion;
a depth of the operation portion is from 10 nm to 1000 nm;
a width of the operation portion is at least 2 µm;
at least either a depth or a width of the nanochannel is from 10 nm to 900 nm;
a Young's modulus of the first substrate and the second substrate is $10^9$ Pa or higher.

18. The nano-fluidic device according to claim 17, wherein the Young's modulus of the first substrate and the second substrate is from $10^{10}$ to $10^{11}$ Pa.

19. A nano-fluidic device, comprising:
a first substrate comprising a nanoscale groove and a protrusion on one surface, wherein the protrusion comprises an operation portion overlapping the nanoscale groove; and
a second substrate comprising a groove portion in a position facing the protrusion in the operation portion, wherein the second substrate is integrally provided with the first substrate by bonding one surface of the second substrate to the one surface of the first substrate and forms a nanoscale channel with the nanoscale groove of the first substrate,
wherein:
the nanoscale channel comprises a first portion comprising a channel portion that extends in one direction and further comprises a second portion comprising the operation portion, wherein a thickness of the second portion is smaller than that of the first portion, wherein the operation portion further comprises the groove portion of the second substrate, and wherein the operation portion has a wider width than the channel portion,
the second portion is configured to be deformed by pressing to close the nanoscale channel, wherein the second portion does not protrude from the surface of the second substrate and is flat along the plane of the second substrate when not in a pressed state such that the nanochannel is open when the second portion is not pressed, and wherein a Young's modulus of the first substrate and the second substrate, which form the first portion and the second portion of the nanoscale channel, is $10^9$ Pa or higher, a depth of the operation portion is 10 nm to 1000 nm, a width of the operation portion is 2 μm or more, wherein all parts facing the nanochannel and the operation portion are formed of an inorganic material, and the Young's modulus of the first substrate and the second substrate, which form the first portion and the second portion of the nanoscale channel, is from $10^{10}$ to $10^{11}$ Pa.

20. A nano-fluidic device, comprising:

a first substrate comprising a nanoscale groove and a protrusion on one surface, wherein the protrusion comprises an operation portion overlapping the nanoscale groove, and a second substrate, wherein the second substrate is integrally provided with the first substrate by bonding one surface of the second substrate to the one surface of the first substrate and forms a nanoscale channel with the nanoscale groove of the first substrate, wherein:

the first substrate comprises a thin portion in a part of a position overlapping the nanochannel in plan view, the nanoscale channel comprises a channel portion that extends in one direction and further comprises the operation portion, wherein the operation portion has a wider width than the channel portion, the thin portion of the first substrate is configured to be deformed by pressing from a side opposite to the one surface of the first substrate to close the nanoscale channel, wherein the thin portion does not protrude from the surface of the first substrate and is flat along the plane of the first substrate when not in a pressed state such that the nanochannel is open when the thin portion is not pressed, and wherein a Young's modulus of the first substrate and the second substrate, which form the first portion and the second portion of the nanoscale channel, is $10^9$ Pa or higher, a depth of the operation portion is 10 nm to 1000 nm, a width of the operation portion is 2 μm or more.

21. The nano-fluidic device according to claim 20, wherein all parts facing the nanochannel and the operation portion are formed of an inorganic material, and the Young's modulus of the first substrate and the second substrate, which form the first portion and the second portion of the nanoscale channel, is from $10^{10}$ to $10^{11}$ Pa.

22. The nano-fluidic device according to claim 20, wherein a width of the nanochannel is from 10 nm to 900 nm.

23. A nano-fluidic device, comprising:

a first substrate comprising a nanoscale groove and a protrusion on one surface, wherein the protrusion comprises an operation portion overlapping the nanoscale groove, and a second substrate, wherein the second substrate is integrally provided with the first substrate by bonding one surface of the second substrate to the one surface of the first substrate and forms a nanoscale channel with the nanoscale groove of the first substrate, wherein:

the second substrate comprises a thin portion in a part of a position overlapping the nanochannel in plan view, the nanoscale channel comprises a channel portion that extends in one direction and further comprises the operation portion, wherein the operation portion has a wider width than the channel portion, the thin portion of the second substrate is configured to be deformed by pressing from a side opposite to the one surface of the second substrate to close the nanoscale channel, wherein the thin portion does not protrude from the surface of the second substrate and is flat along the plane of the second substrate when not in a pressed state such that the nanochannel is open when the thin portion is not pressed, and wherein a Young's modulus of the first substrate and the second substrate, which form a first portion and a second portion of the nanoscale channel, is 109 Pa or higher, a depth of the operation portion is 10 nm to 1000 nm, a width of the operation portion is 2 μm or more.

* * * * *

UNITED STATES PATENT AND TRADEMARK OFFICE
CERTIFICATE OF CORRECTION

| | |
|---|---|
| PATENT NO. | : 11,565,253 B2 |
| APPLICATION NO. | : 15/764529 |
| DATED | : January 31, 2023 |
| INVENTOR(S) | : Yutaka Kazoe et al. |

It is certified that error appears in the above-identified patent and that said Letters Patent is hereby corrected as shown below:

In the Claims

Column 18, Line 39, Claim 23, "109 Pa" should read --$10^9$ Pa--.

Signed and Sealed this
Twenty-third Day of May, 2023

Katherine Kelly Vidal
*Director of the United States Patent and Trademark Office*